(12) United States Patent
Schnattinger et al.

(10) Patent No.: US 10,739,399 B2
(45) Date of Patent: Aug. 11, 2020

(54) MEASUREMENT APPARATUS FOR MEASUREMENT OF AN RF SIGNAL

(71) Applicant: Rohde & Schwarz GmbH & Co. KG, Munich (DE)

(72) Inventors: Georg Schnattinger, Dorfen (DE); Marcel Thränhardt, Freising (DE); Michael Kaltenbach, Olching (DE)

(73) Assignee: ROHDE & SCHWARZ & CO. KG, Munich (DE)

( * ) Notice: Subject to any disclaimer, the term of this patent is extended or adjusted under 35 U.S.C. 154(b) by 314 days.

(21) Appl. No.: 15/939,769

(22) Filed: Mar. 29, 2018

(65) Prior Publication Data

US 2019/0302173 A1  Oct. 3, 2019

(51) Int. Cl.
| | |
|---|---|
| *G01R 31/28* | (2006.01) |
| *G01R 23/165* | (2006.01) |
| *G01R 23/02* | (2006.01) |
| *H04B 1/00* | (2006.01) |
| *H04B 1/40* | (2015.01) |
| *H04B 1/3805* | (2015.01) |
| *H04L 27/00* | (2006.01) |

(52) U.S. Cl.
CPC ......... *G01R 31/2822* (2013.01); *G01R 23/02* (2013.01); *G01R 23/165* (2013.01); *H04B 1/0007* (2013.01); *H04B 1/40* (2013.01); *H04B 2001/3811* (2013.01); *H04L 2027/0016* (2013.01)

(58) Field of Classification Search
CPC .. G01R 31/2822; G01R 23/165; G01R 23/02; H04B 1/0007; H04B 1/40; H04B 2001/3811; H04B 1/1027; H04B 2001/1054; H04L 2027/0016
See application file for complete search history.

(56) References Cited

U.S. PATENT DOCUMENTS

| | | | |
|---|---|---|---|
| 2008/0090536 A1* | 4/2008 | Okada | H03J 7/02 455/208 |
| 2012/0020397 A1 | 1/2012 | Estrada et al. | |
| 2016/0099784 A1 | 4/2016 | Bratfisch et al. | |
| 2016/0211872 A1* | 7/2016 | Sim | H04B 1/1027 |

* cited by examiner

*Primary Examiner* — Amy He
(74) *Attorney, Agent, or Firm* — Westman, Champlin & Koehler, P.A.

(57) ABSTRACT

A measurement apparatus and method for measurement of a radio frequency (RF) signal, said measurement apparatus comprising a signal input adapted to receive an RF-signal being split into a first measurement signal path and into a second measurement signal path of said measurement apparatus, wherein said first measurement signal path is adapted to measure the split RF-signal within a predefined first frequency band around a predefined measurement frequency, wherein said second measurement signal path is adapted to measure a current frequency at a power maximum of the split RF-signal in a predefined second frequency band, and wherein the RF-signal measured in said first measurement signal path is shifted in the frequency domain depending on the current frequency measured in said second measurement signal path.

15 Claims, 6 Drawing Sheets

MEASUREMENT APPARATUS FOR MEASUREMENT OF AN RF SIGNAL

TECHNICAL FIELD

The invention relates to an apparatus and a method for measurement of a radio frequency RF, signal provided by a device under test.

TECHNICAL BACKGROUND

There is a wide range of applications where it is necessary to measure and analyze radio frequency signals. Communication systems comprise entities or devices which have to be tested or measured during a development stage and/or during operation of the communication system. Communication systems can comprise a wireless communication system including devices generating radio frequency signals. Radio frequency signals are typically analyzed using a measurement device such as a digital oscilloscope or a network analyzer. Such a measurement devices can be quite heavy, space consuming as well as complex in structure and consequently, cost intensive in the implementation. For many applications it is desired to use more compact measurement devices requiring a less complex hardware and/or software implementation. Accordingly, there is a need to provide a method and apparatus which can be used for measurement of radio frequency signals with less complexity.

SUMMARY OF THE INVENTION

The invention provides according to a first aspect a measurement apparatus for measurement of a radio frequency, RF, signal wherein said measurement apparatus comprises:
  a signal input adapted to receive an RF-signal being split into a first measurement signal path and into a second measurement signal path of said measurement apparatus,
  wherein the first measurement signal path is adapted to measure the split RF-signal within a predefined first frequency band around a predefined measurement frequency,
  wherein said second measurement signal path is adapted to measure a current frequency at a power maximum of the split RF-signal in a predefined second frequency band,
  wherein the RF-signal measured in said first measurement signal path is shifted in the frequency domain depending on the current frequency measured in said second measurement signal path.

In a possible embodiment of the measurement apparatus according to the first aspect or the present invention the apparatus comprises an indication unit adapted to indicate a frequency offset between the preset measurement frequency and the current frequency measured in the second measurement signal path.

In a possible embodiment of the measurement apparatus according to the first aspect of the present invention the preset measurement frequency used in the first measurement signal path is a predefined measurement carrier frequency stored in a memory and the current frequency measured in the second measurement signal path is a measured carrier frequency of the received RF-signal.

In a further possible embodiment of the measurement apparatus according to the first aspect of the present invention a frequency offset between the predefined or preset measurement frequency used in the first measurement signal path and the current frequency measured in the second measurement signal path is determined by a frequency correction unit of said measurement apparatus.

In a further possible embodiment of the measurement apparatus according to the first aspect of the present invention the RF-signal measured by the first measurement signal path is shifted in the frequency domain by a frequency shift unit of said measurement apparatus depending on the determined frequency offset provided by the frequency correction unit.

In a further possible embodiment of the measurement apparatus according to the first aspect of the present invention the predefined second frequency band of the second measurement signal path comprises a wider bandwidth than the predefined first frequency band of the first measurement signal path.

In a still further possible embodiment of the measurement apparatus according to the first aspect of the present invention the frequency shifted RF-signal measured in the first measurement signal path and/or the current frequency measured in the second measurement signal path are supplied to a local processing unit of said measurement apparatus which is adapted to process the frequency shifted RF-signal and/or the measured current frequency to calculate characterizing parameters of the RF-signal received by the signal input of said measurement apparatus.

In a further possible embodiment of the measurement apparatus according to the first aspect of the present invention frequency RF-signal measured in the first measurement signal path and/or the current frequency measured in the second measurement signal path are supplied to a remote processing unit which is adapted to process the frequency shifted RF-signal and/or the measured current frequency to calculate characterizing parameters of the RF-signal, received by the signal input of the measurement apparatus.

In a possible embodiment of the measurement apparatus according to the first aspect of the present invention the signal input of the measurement apparatus is connectable to at least one device under test to receive the RF-signal from said device under test.

In a still further possible embodiment of the measurement apparatus according to the first aspect of the present invention the first measurement signal path of the measurement apparatus comprises
  a bandpass filter unit adapted to filter the split RF-signal,
  a down conversion unit adapted to perform a shift of the split RF-signal in the frequency domain in response to the current frequency measured in said second measurement signal path and
  and a low pass filter unit with a resolution bandwidth having a filter input connected to the output of the down conversion unit and having a filter output connected to the processing unit of said measurement apparatus.

In a further possible embodiment of the measurement apparatus according to the first aspect of the present invention the first measurement signal path and the second measurement signal path both comprise an analog to digital conversion unit adapted to convert an analog signal into a digital signal.

In a further possible embodiment of the measurement apparatus according to the first aspect of the present invention the analog to digital conversion unit of the first measurement signal path provides a digital IQ data stream including complex IQ data samples supplied to a digital input interface of a digital processing unit of said measurement apparatus.

In a further possible embodiment of the measurement apparatus according to the first aspect of the present invention a frequency correction unit is integrated in the digital processing unit of said measurement apparatus and is adapted to calculate a frequency offset value between a predefined or preset measurement frequency value stored in a data memory and a current frequency value provided by the second measurement signal path of said measurement apparatus.

In a further possible embodiment of the measurement apparatus according to the first aspect of the present invention the characterizing parameters of the RF-signal calculated by the local and/or remote processing unit comprise
an error vector magnitude,
an adjacent channel leakage ratio,
a signal power,
a carrier frequency, and
a frequency offset between a measured carrier frequency and a predefined carrier frequency.

In a still further possible embodiment of the measurement apparatus according to the first aspect of the present invention a local digital processing unit integrated in the measurement apparatus comprises
a first digital interface adapted to receive a digital IQ data stream from the first measurement signal path and a current frequency value from the second measurement signal path and
a second digital interface connected via a data network to a remote digital processing unit.

In a still further possible embodiment of the measurement apparatus according to the first aspect of the present invention the processing unit is connected to a user interface of said measurement apparatus adapted to output the characterizing parameters provided by the processing unit of said measurement apparatus and/or to indicate a frequency offset between a preset measurement frequency and a current frequency measured by a power meter of the second measurement signal path.

In a still further possible embodiment of the measurement apparatus according to the first aspect of the present invention the measurements are performed in a zero span operation mode of said measurement apparatus,
wherein the frequency correction unit integrated in or connected to the digital processing unit of the measurement apparatus is enabled in the zero span operation mode of said measurement apparatus.

The invention provides according to a second aspect a method for measuring an RF-signal comprising the steps of:
splitting a received RF-signal into a first measurement signal path and into a second measurement signal path,
measuring in the first signal path the split RF-signal in a predefined first frequency band around a preset measurement frequency,
measuring in the second measurement signal path the split RF-signal in a predefined second frequency band to provide a current frequency at a determined power maximum of the split second RF-signal,
shifting the RF-signal measured in the first measurement signal path in the frequency domain depending on the current frequency provided by the second measurement signal path. In a possible embodiment of the method according to the second aspect of the present invention a frequency offset between the preset measurement frequency and the current frequency measured in the second measurement signal path is indicated.

BRIEF DESCRIPTION OF THE FIGURES

In the following possible embodiments of the different aspects of the present invention are described in more detail with reference to the enclosed figures.

Features, aspects and advantages of the present invention will become better understood with regard to the following description, appended claims and accompanying figures. Identical components in the figures are provided with the same reference numbers. Accordingly, embodiments of the present invention are illustrated by way of example and not by way of limitation in the figures. The different embodiments illustrated in the figures can be combined with each other.

DETAILED DESCRIPTION OF EMBODIMENTS

Figure 1:
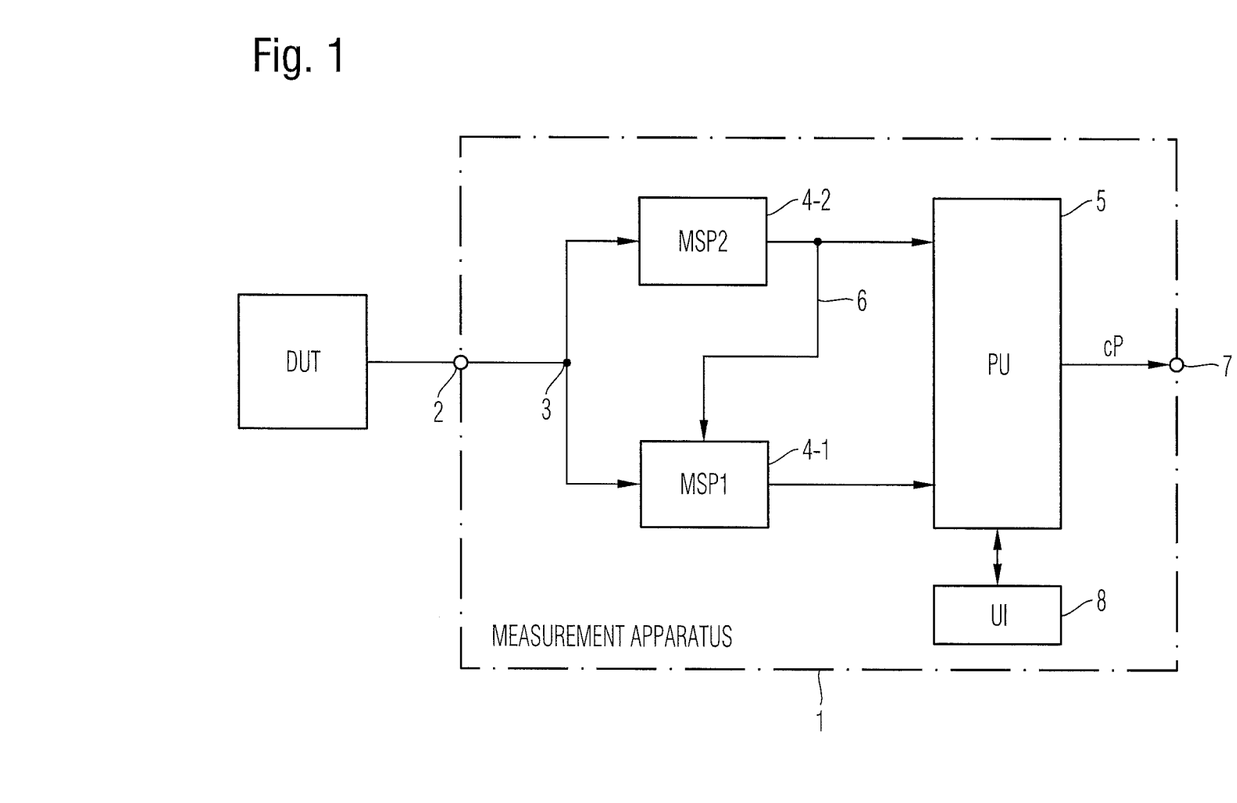
FIG. 1 shows a block diagram of a possible exemplary embodiment of a measurement apparatus for measurement of a radio frequency, RF, signal, according to the first aspect of the present invention.

As can be seen in the block diagram of FIG. 1 a measurement apparatus 1 for measurement of a radio frequency, RF, signal comprises a signal input 2 connectable to an external device under test DUT. The signal input port 2 is adapted to receive an RF-signal from the device under test DUT. The received radio frequency signal is split in the illustrated exemplary embodiment at node 3 into a first measurement signal path 4-1 and into a second measurement signal path 4-2 of the measurement apparatus 1. The first measurement signal path 4-1 is adapted to measure the split RF-signal with a predefined first frequency band FB1 resolution bandwidth around a preset measurement frequency. The predefined or preset measurement frequency used in the first measurement signal path 4-1 can in a possible embodiment be a predefined measurement carrier frequency stored in a memory of the measurement apparatus 1. The measurement frequency used in the first measurement signal path 4-1 can be set in a possible embodiment by means of a user interface 8. The second measurement signal path 4-2 of the measurement apparatus 1 is adapted to measure a current frequency at a power maximum of the split RF-signal in a predefined second frequency band FB2. The current frequency measured in the second measurement signal path 4-2 is the measured carrier frequency of the RF-signal received at the signal input 2 of the measurement apparatus 1. As illustrated in the embodiment of FIG. 1 first measurement signal path 4-1 and the second measurement signal path 4-2 are both connected to a processing unit 5 of the measurement apparatus 1 as shown in FIG. 1.

The RF-signal measured in the first measurement signal path 4-1 is shifted in the frequency domain depending on the current frequency measured in the second measurement signal path 4-2. The current frequency measured in the second measurement signal path 4-2 is applied via a signal line 6 to the first measurement signal path 4-1 as illustrated in FIG. 1. The current frequency measured in the second measurement signal path 4-2 and applied via signal line 6 to the first measurement signal path 4-1 can be a measured carrier frequency of the received RF-signal. The RF-signal measured in the first measurement signal path 4-1 can be shifted in the frequency domain by a frequency shift unit within the first measurement signal path 4-1. In a possible implementation the frequency shift can be performed depending on a measured or determined frequency offset between the predefined measurement frequency and the measured current frequency provided by the second measurement signal path 4-2. In a possible embodiment, the predefined second frequency band FB2 of the second measurement signal path 4-2 does comprise a wider bandwidth than the predefined first frequency band FB1 of the first measurement signal path 4-1 (e.g. 50% wider bandwidth). In the illustrated embodiment of FIG. 1 the frequency shifted RF-signal measured in the first measurement signal path 4-1 and the current frequency measured in the second measurement signal path 4-2 are supplied to the processing unit 5 of the measurement apparatus 1. The processing unit 5 is adapted to process the frequency shifted RF-signal received from the first measurement signal path 4-1 and the measured current frequency received from the second measurement signal path 4-2 to calculate characterizing parameters cP of the received RF-signal.

The characterizing parameters cP calculated by the processing unit 5 can comprise in a possible embodiment an error vector magnitude EVM, an adjacent channel leakage ratio ACLR, a signal power of the RF-signal, a carrier frequency, and/or a frequency offset between a measured carrier frequency and a predefined carrier frequency of the received RF-signal. The calculated characterizing parameters cP can in a possible embodiment be output by means of a user interface and/or by a data output 7 of the measurement apparatus 1. In a possible embodiment, the processing unit 5 calculates an error vector magnitude EVM (sometimes also called relative constellation error). The error vector magnitude is a measure used to quantify a performance of a digital radio transmitter or receiver. A signal sent by an ideal transmitter or received by a receiver would have all constellation points precisely at the ideal locations, however various imperfections in the implementation such as carrier leakage, low image rejection ratio, phase noise etc. can cause the actual constellation points to deviate from the ideal locations. Noise, distortion, spurious signals, and phase noise can all degrade the error vector magnitude EVM. Consequently, the error vector magnitude EVM performing a characterizing parameter cP of the received RF-signal provides a comprehensive measure of the quality of the device under test DUT such as a radio receiver or radio transmitter used in digital communication systems.

The characterizing parameter cP calculated by the local processing unit 5 comprises in a possible embodiment also an adjacent channel leakage ratio ACLR. The adjacent channel leakage ratio ACLR is defined as the ratio of a transmitted power to the power in adjacent radio channel. Leakage power does influence the system capacity as it interferes with the transmission in adjacent channels. Therefore, the leakage power must be controlled to guarantee communication for all subscribers in a communication network. The characterizing parameters cP calculated by the processing unit 5 further comprise an average signal power of the received RF-signal and/or a carrier frequency $f_c$ of the received RF-signal. Further possible characterizing parameter output by the processing unit 5 can comprise a frequency offset $\Delta f$ between a measured carrier frequency and a predefined carrier frequency. In a possible embodiment, the frequency offset between the measurement frequency used in the first measurement signal path 4-1 input by a user or by a control unit and the current frequency measured by the second measurement signal path 4-2 can be determined by a frequency correction unit FCU integrated in the processing unit 5 of the measurement apparatus 1. In a possible embodiment, the RF-signal measured in the first measurement signal path is shifted by a frequency shift unit of the first measurement signal path 4-1 in the frequency domain depending on the frequency offset $\Delta f$ determined by the frequency correction unit FCU. The measurement apparatus 1 can provide a measurement result without drifting carrier frequency. The user interface 8 comprises an indication unit to indicate the frequency offset $\Delta f$ between the measurement frequency preset by the user and the current frequency measured by a power meter of the second measurement signal path. The user interface 8 allows to input the preset measurement frequency used by the first measurement signal path 4-1.

Figure 2:
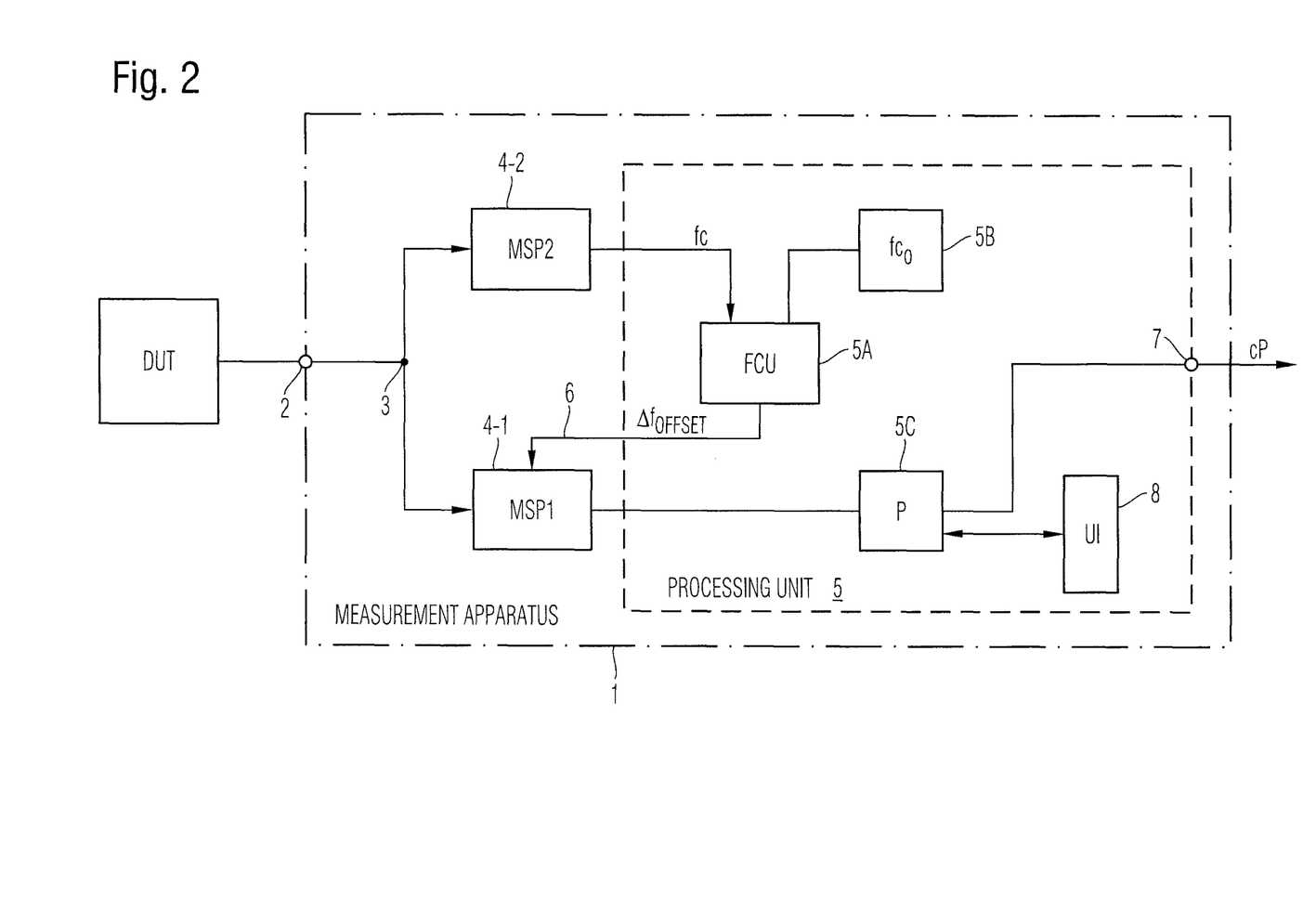
FIG. 2 shows a further block diagram of a possible exemplary embodiment of a measurement apparatus for measurement of a radio frequency, RF, signal according to the first aspect of the present invention.

FIG. 2 shows a block diagram of a possible exemplary embodiment of a measurement apparatus according to the first aspect of the present invention. In the illustrated embodiment of FIG. 2 the processing unit 5 comprises an integrated frequency correction unit (FCU) 5A. The frequency offset between the predefined measured carrier frequency used in the first measurement signal path 4-1 and stored in a local memory 5B of the processing unit 5 and the current carrier frequency measured by the second measurement signal path 4-2 is determined by the frequency correction unit 5A and supplied via signal line 6 a frequency shift unit of to the first measurement signal path 4-1 as shown in FIG. 2. In the illustrated embodiment of FIG. 2 the frequency correction unit FCU 5A is integrated in the processing unit 5. In a alternative embodiment the frequency correction unit FCU can be a separate unit connected to the first measurement signal path 4-1, the second measurement signal path 4-2 and to a local data memory of the measurement apparatus 1. In the illustrated embodiment in FIG. 2 the signal output by the first measurement signal path 4-1 is supplied to a processor 5C of the processing unit 5 which is adapted to calculate one or more characterizing parameters cP of the received RF-signal including an error vector magnitude EVM, an adjacent channel leakage ratio ACLR, a signal power of the received RF-signal, a carrier frequency and/or a frequency offset $\Delta f$ between the measured carrier frequency and a predefined carrier frequency. The calculated characterizing parameters cP can be output via an output interface 7 of the measurement apparatus 1 as illustrated in FIG. 2. Further, the calculated characterizing parameters cP can be output to a user via the user interface 8 of the measurement apparatus 1. The user interface 8 can comprise a graphical user interface GUI having a display adapted to display the different characterizing parameters calculated by the processor 5C of the processing unit 5.

The measurements and calculations can be performed in a possible embodiment in a zero span operation mode of the measurement apparatus 1. The frequency correction unit FCU 5A can be enabled in the zero span operation mode (ZSOM) to calculate the frequency offset supplied to the first measurement signal path 4-1 of the measurement apparatus 1. In a possible embodiment, the characterizing parameters cP calculated by the processor 5C of the processing unit 5 can be calculated as a function of time. In a possible embodiment, the zero span operation mode (ZSOM) is implemented by use of an analog RBW filter. In a preferred embodiment of the measurement apparatus 1 according to the present invention the zero span operation mode is implemented digitally without use of an analog RBW filter. In the zero span operation mode (ZSOM) the resolution bandwidth RBW directly affects the effective instantaneous bandwidth IBW of the measurement. The measurement apparatus 1 can zoom into a single spectral line with the resulting calculated parameter output or displayed as a function of time. The configured resolution bandwidth is generally wider than the frequency band of interest for the output signal. The zero span operation mode of the measurement apparatus 1 can be used to configure trigger levels on a gated spectrum measurement. For example, the signal may only be present for some micro seconds with relatively long periods of time between bursts. In this scenario analyzing the signal spectrum requires a configuration of a power trigger to time gate the spectrum display. When configuring the triggered spectrum acquisition the zero span operation mode of the measurement apparatus 1 can be used for determining an appropriate trigger level in addition to signal characteristics such as the duration of signal pulses. The trigger level allows the measurement apparatus 1 to trigger on a signal both in the time and the frequency domain. In addition the zero span operation mode of the measurement apparatus 1 can be used for performing pulse power measurements.

Figure 3:
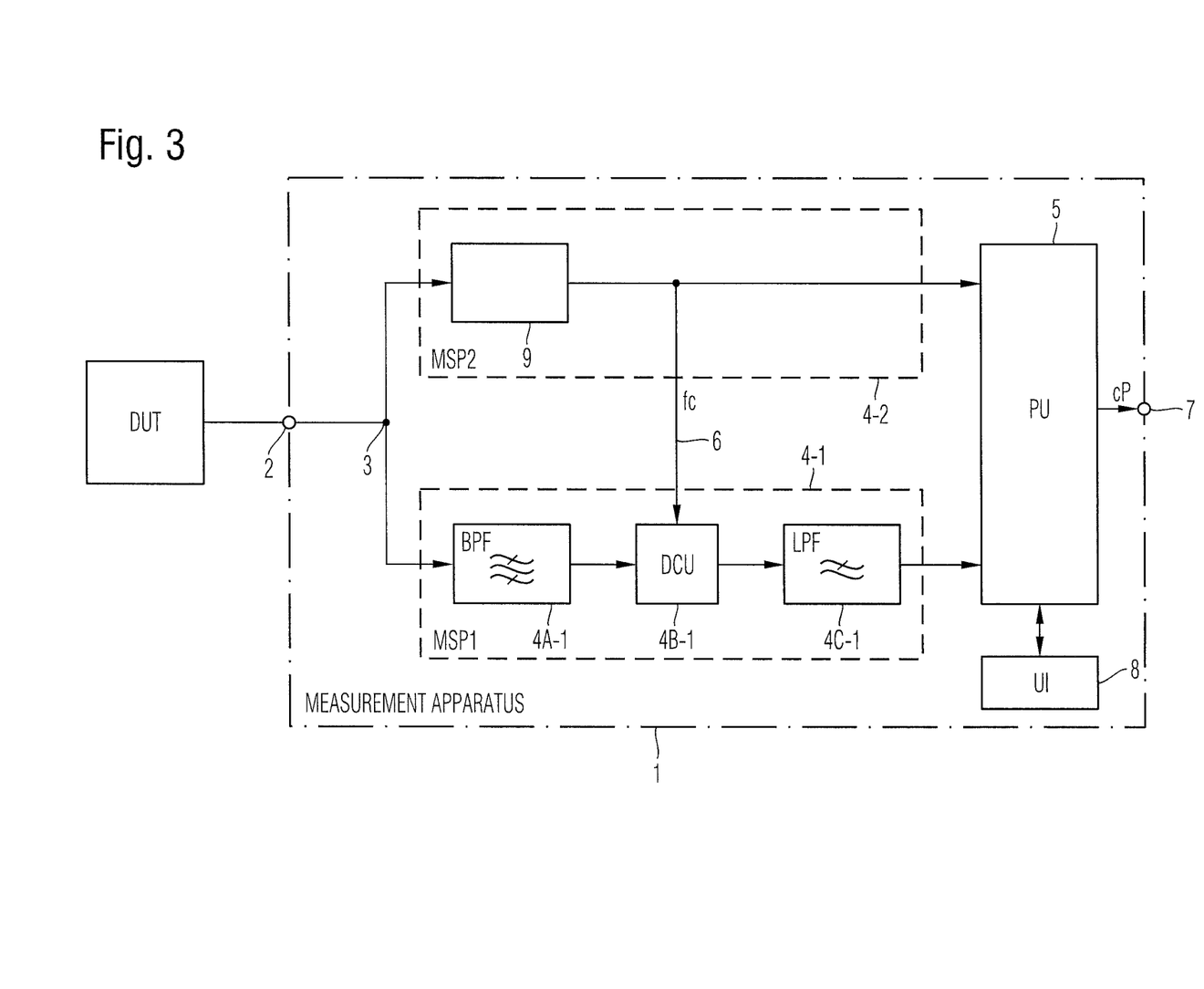
FIG. 3 shows a block diagram of a further possible exemplary embodiment of a measurement apparatus for measurement of a radio frequency, RF, signal according to the first aspect of the present invention.

FIG. 3 shows a block diagram of a further exemplary embodiment of a measurement apparatus 1 according to the first aspect of the present invention. As illustrated in the embodiment of FIG. 3 the first measurement signal path 4-1 comprises a bandpass filter unit 4A-1, down conversion unit 4B-1 and a low pass filter unit 4C-1. The bandpass filter unit 4A-1 is adapted to filter the split RF-signal in a predefined frequency range. The down conversion unit 4B-1 is adapted to perform a shift of the split RF-signal filtered by the bandpass filter unit 4A-1 in the frequency domain in response to the current frequency measured by the second measurement signal path 4-2 and supplied to the down conversion unit 4B-1 via signal line 6 as illustrated in FIG. 3. The down conversion unit 4B-1 can comprise a multiplier to perform a frequency shift in the frequency domain. The low pass filter unit 4C-1 comprises a resolution bandwidth RBW wherein the filter input of the low pass filter unit 4C-1 is connected to the output of the down conversion unit 4B-1 as shown in FIG. 3. Further, the filter output of the low pass filter unit 4C-1 is connected to an output of the processing unit 5 of the measurement apparatus 1. In the illustrated embodiment in FIG. 3, the second measurement signal path 4-2 comprises a signal processing unit or power meter 9 adapted to measure a current frequency at a power maximum of the split RF-signal in a predefined second frequency band. In a possible embodiment, the signal processing unit 9 can evaluate the signal spectrum of the received RF-signal to determine a frequency at a power maximum of the signal spectrum. The power meter 9 can correct or adjust the frequency input or set by the user via the user interface 8 through a frequency shift.

In a possible embodiment, the first measurement signal path 4-1 and the second measurement signal path 4-2 can both comprise an analog to digital conversion unit ADC adapted to convert an analog signal into a digital signal. The analog to digital conversion unit ADC of the first measurement signal path 4-1 can provide a digital IQ data stream including complex IQ data samples. The IQ data stream including the complex IQ data samples are supplied in a possible embodiment to a digital input interface of the digital processing unit 5 of the measurement apparatus 1. The digital processing unit 5 is adapted to calculate a frequency offset value between the predefined measurement frequency value stored in a data memory and a current frequency value provided by the second measurement signal path of the measurement apparatus. The measurement digital IQ data samples of the measured signal can be shifted by the frequency offset. In a possible embodiment, the local digital processing unit 5 shown in FIG. 3 can be integrated in the measurement apparatus 1 and comprise a first digital interface adapted to receive a digital IQ data stream from the first measurement signal path 4-1 and a current frequency value from the second measurement signal path 4-2. The apparatus 1 forms a I/Q streamer with frequency offset measurement and correction in a zero span operation mode.

Figure 5:
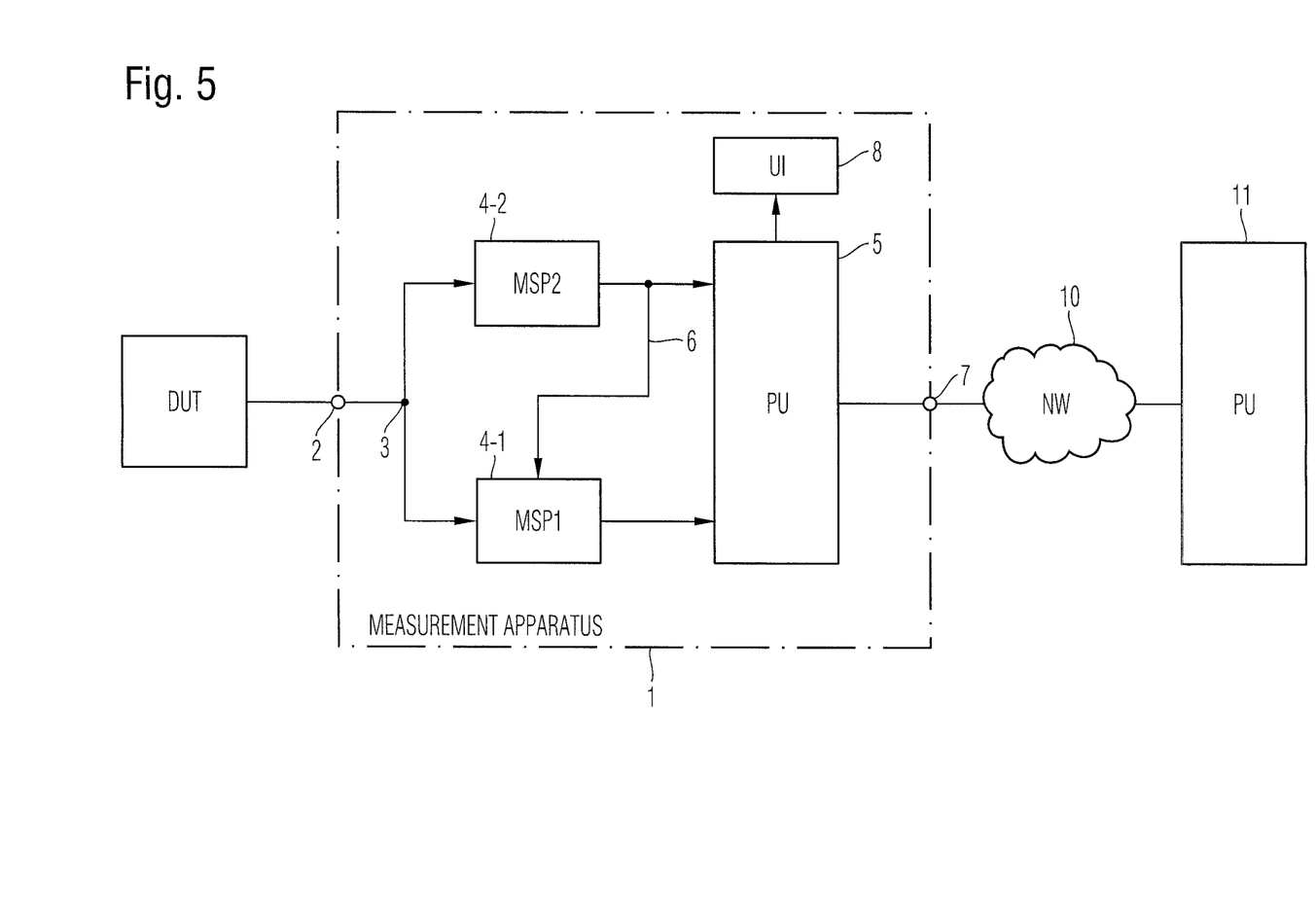
FIG. 5 shows a block diagram of a further exemplary embodiment of a measurement apparatus for measurement of an RF-signal according to the first aspect of the present invention.

The digital processing unit 5 can further comprise in a possible embodiment a second digital interface connected via a data network 10 to a remote digital processing unit as also illustrated in the embodiment shown in FIG. 5. As illustrated in FIG. 5 the output interface 7 of the measurement apparatus 1 is connected via the data network 10 to a remote processing unit 11. In the illustrated embodiment of FIG. 5 the frequency shifted RF-signal measured in the first measurement signal path 4-1 and the current frequency measured in the second measurement signal path 4-2 are supplied to the local processing unit 5 of the measurement apparatus 1 adapted to perform a preprocessing of the received data e.g. encapsulating the data as payload into data packets, transmitted via the data network 10 to the remote processing unit 11 for further processing. The remote processing unit 11 can be implemented on a server and can be adapted to process the received data i.e. the frequency shifted RF-signal and/or the measured current frequency to calculate characterizing parameters cP of the RF-signal. The advantage of the embodiment illustrated in FIG. 5 is that the remote processing unit 11 comprises more processing resources than the measurement apparatus 1.

The measurement apparatus 1 can comprise in a possible embodiment an analog front end detector used for processing the received RF-signal.

Figure 4:
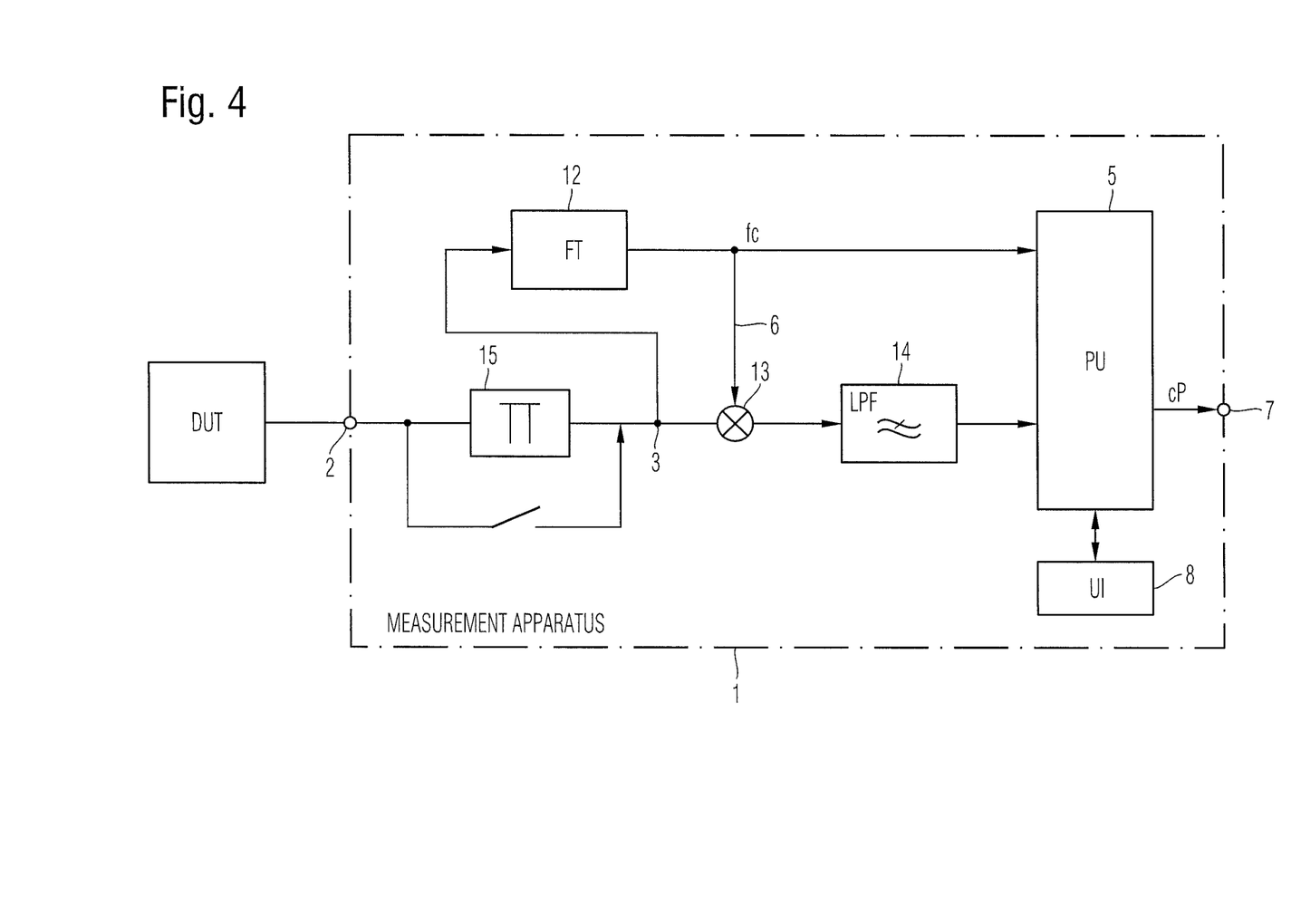
FIG. 4 shows a block diagram of a further exemplary embodiment of a measurement apparatus for measurement of a radio frequency, RF, signal according to the first aspect of the present invention.

FIG. 4 shows a block diagram of a further possible exemplary embodiment of a measurement apparatus 1 according to the present invention. In the illustrated embodiment the split RF-signal is applied to a frequency tracker 12 providing a center frequency or carrier frequency of the received analog RF-signal. The center frequency is supplied to a multiplier 13 to perform a frequency shift in the frequency domain of the received RF-signal. The frequency shifted signal is supplied to a low pass filter 14 with a resolution bandwidth RBW. The low pass filter 14 can comprise an anti-aliasing low pass filter. Further, a filter 15 can be provided at the analog frontend of the measurement apparatus 1 allowing calibration. The processing unit 5 in the embodiment of FIG. 4 does in a possible embodiment measure the signal power of the received RF-signal.

In the illustrated embodiments of FIGS. 1 to 5 the measurement apparatus 1 comprises two separate measurement signal paths 4-1, 4-2. In further possible embodiments the number of separate measurement signal paths 4-$i$ can be higher, e.g. three, four and even more separate measurement signal paths. In a possible embodiment the measurement signal paths 4-$i$ and the processing unit 5 can be integrated on a common FPGA chip. By means of the user interface 8 a user gets information about the real frequency and a frequency drift for precise measurements. The measurement apparatus 1 provides for zero span spectrum measurements in a corresponding operation mode which can be selected by the user of the measurement apparatus 1. The apparatus provides IQ data streaming with frequency offset measurement and correction in the zero span operation mode.

Figure 6:
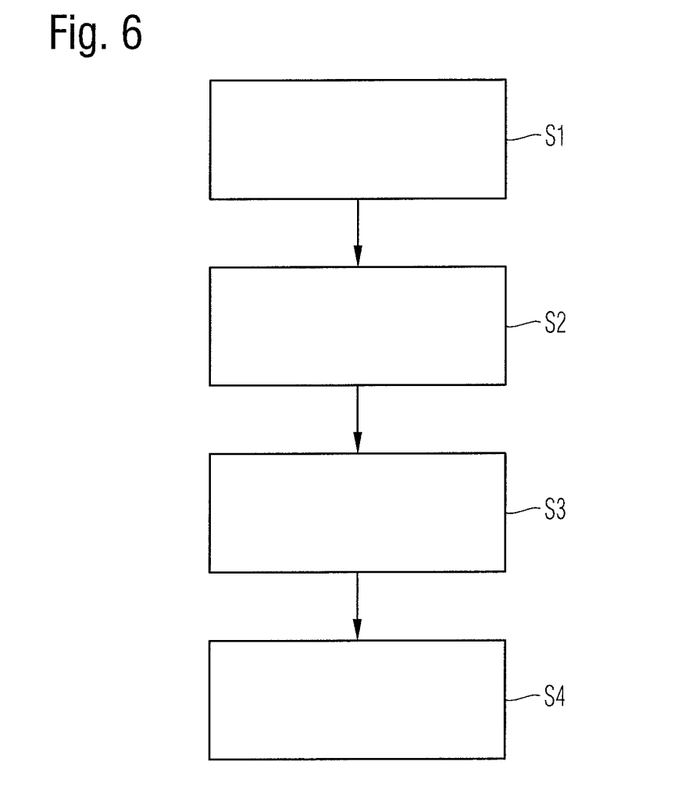
FIG. 6 shows a flowchart of a possible exemplary embodiment of a method for measurement of a radio frequency, RF, signal according to the second aspect of the present invention.

FIG. 6 shows a flow chart of a possible exemplary embodiment of a method for measuring an RF-signal according to a further aspect of the present invention. The illustrated exemplary embodiment the method has several main steps.

In a first step S1 a received RF-signal is split into a first measurement signal path and into a second measurement signal path.

In a further step S2 measurement is performed in the first signal path and in the second measurement signal path. In the first measurement signal path the split RF-signal is measured in a predefined first frequency band FB1 around a predefined or preset measurement frequency. In the second signal path the split RF-signal is measured by a power meter in a predefined second frequency band FB2 to provide a current frequency at a determined power maximum of the split second RF-signal.

In a further step S3 the RF-signal measured in the first measurement signal path is shifted in the frequency domain depending on the current frequency measured by the second measurement signal path.

In a step S4 a frequency offset between the preset measurement frequency and the current frequency measured in the second measurement signal path and/or a current measurement frequency can be indicated to a user.

In a further step (not illustrated in FIG. 6) the frequency shifted RF-signal and the measured current frequency are evaluated to calculate one or more characterizing parameters cP of the received RF-signal. The characterizing parameters cP can be output to a user via a user interface and/or output to a control unit or system. The measurement apparatus 1 can provide measurement results without drifting carrier frequencies. The measurement apparatus 1 can be implemented within a compact device requiring less complexity with regard to hardware and/or software components.

The invention claimed is:

1. A measurement apparatus for measurement of a radiofrequency (RF) signal,
    said measurement apparatus comprising:
        a signal input adapted to receive an RF-signal being split into a first measurement signal path and into a second measurement signal path of said measurement apparatus,
        wherein said first measurement signal path is adapted to measure the split RF-signal within a predefined first frequency band around a preset measurement frequency,
        wherein said second measurement signal path is adapted to measure a current frequency at a power maximum of the split RF-signal in a predefined second frequency band,
        wherein the RF-signal measured in said first measurement signal path is shifted in the frequency domain depending on the current frequency measured in said second measurement signal path.

2. The measurement apparatus according to claim 1, wherein the preset measurement frequency used in the first measurement signal path is a predefined measurement carrier frequency stored in a memory and the current frequency measured in the second measurement signal path is a measured carrier frequency of the received RF signal.

3. The measurement apparatus according to claim 1, wherein a frequency offset between the predefined measurement frequency used in the first measurement signal path and the current frequency measured in the second measurement signal path is determined by a frequency correction unit (FCU) of said measurement apparatus.

4. The measurement apparatus according to claim 3, wherein the RF-signal measured in the first measurement signal path is shifted in the frequency domain by a frequency shift unit of said measurement apparatus depending on the determined frequency offset provided by the frequency correction unit (FCU).

5. The measurement apparatus according to claim 1, wherein the predefined second frequency band of the second measurement signal path comprises a wider bandwidth than the predefined first frequency band of the first measurement signal path.

6. The measurement apparatus according to claim 1, wherein at least one of the group comprising the frequency shifted RF-signal measured in the first measurement signal path and the current frequency measured in the second measurement signal path are supplied to at least one of the group comprising a local processing unit of said measurement apparatus and a remote processing unit which process one of the group comprising the frequency shifted RF-signal and the measured current frequency to calculate characterizing parameters of the RF-signal, received by the signal input of the measurement apparatus.

7. The measurement apparatus according to claim 6, wherein the characterizing parameters cP of the RF-signal calculated by one of the group comprising the local processing unit and the remote processing unit comprise
    an error vector magnitude (EVM),
    an adjacent channel leakage ratio (ACLR),
    a signal power,
    a carrier frequency, and
    a frequency offset between a measured carrier frequency and a predefined carrier frequency.

8. The measurement apparatus according to claim 7, wherein a local digital processing unit integrated in the measurement apparatus comprises
    a first digital interface adapted to receive a digital IQ data stream from the first measurement signal path and a current frequency value from the second measurement signal path and
    a second digital interface connected via a data network to a remote digital processing unit.

9. The measurement apparatus according to claim 8,
wherein the processing unit is connected to one of the group comprising a user interface of said measurement apparatus adapted to output the characterizing parameters cP provided by the processing unit of said measurement apparatus and an indication unit adapted to indicate a frequency offset between a preset measurement frequency and a current frequency measured in the second measurement signal path.

10. The measurement apparatus according to claim 1,
wherein the signal input of the measurement apparatus is connectable to a device under test, DUT to receive the RF-signal from said device under test (DUT).

11. The measurement apparatus according to claim 1,
wherein the first measurement signal path of the measurement apparatus comprises
 a bandpass filter unit adapted to filter the split RF-signal,
 at least one of the group comprising a down conversion unit adapted to perform a shift of the split RF-signal in the frequency domain in response to the current frequency measured in said second measurement signal path,
 and a low pass filter unit with a resolution bandwidth (RBW) having a filter input connected to the output of the down conversion unit and having a filter output connected to the processing unit of said measurement apparatus.

12. The measurement apparatus according to claim 1,
wherein the first measurement signal path and the second measurement signal path both comprise an analog to digital conversion unit adapted to convert an analog signal into a digital signal,
wherein the analog to digital conversion unit of the first measurement signal path provides a digital IQ data stream including complex IQ data samples supplied to a digital input interface of a digital processing unit of the measurement apparatus.

13. The measurement apparatus according to claim 12,
wherein a frequency correction unit (FCU) is integrated in the digital processing unit of the measurement apparatus and is adapted to calculate a frequency offset value between a predefined measurement frequency value stored in a data memory and a current frequency value provided by the second measurement signal path of said measurement apparatus.

14. The measurement apparatus according to claim 13,
wherein the measurements are performed in a zero span operation mode of said measurement apparatus,
wherein the frequency correction unit (FCU) integrated in the digital processing unit of the measurement apparatus is enabled in the zero span operation mode of said measurement apparatus.

15. A method for measuring a RF-signal comprising the steps of:
 splitting a received RF-signal into a first measurement signal path and into a second measurement signal path,
 measuring in the first measurement signal path the split RF-signal in a predefined first frequency band around a preset measurement frequency,
 measuring in the second measurement signal path the split RF-signal in a predefined second frequency band to provide a current frequency at a determined power maximum of the split second RF-signal, and
 shifting the RF-signal measured in the first measurement signal path in the frequency domain depending on the current frequency provided by the second measurement signal path.

* * * * *